United States Patent
Zeng et al.

(10) Patent No.: US 8,583,841 B2
(45) Date of Patent: Nov. 12, 2013

(54) DIGITAL VIDEO DATA RELAY

(75) Inventors: Henry Zeng, Sunnyvale, CA (US); Ji Park, Morgan Hill, CA (US)

(73) Assignee: Synaptics Incorporated, San Jose, CA (US)

( * ) Notice: Subject to any disclaimer, the term of this patent is extended or adjusted under 35 U.S.C. 154(b) by 211 days.

(21) Appl. No.: 12/905,377

(22) Filed: Oct. 15, 2010

(65) Prior Publication Data

US 2012/0096509 A1  Apr. 19, 2012

(51) Int. Cl.
  *G06F 3/00* (2006.01)
  *G06F 13/00* (2006.01)
  *G06F 13/12* (2006.01)

(52) U.S. Cl.
  USPC .................................. 710/65; 710/35; 710/21

(58) Field of Classification Search
  None
  See application file for complete search history.

(56) References Cited

U.S. PATENT DOCUMENTS

| | | | |
|---|---|---|---|
| 8,315,272 B2 * | 11/2012 | Baumer | 370/465 |
| 2005/0024117 A1 * | 2/2005 | Kubo et al. | 327/258 |
| 2007/0107019 A1 * | 5/2007 | Romano et al. | 725/80 |
| 2009/0251602 A1 * | 10/2009 | Williams et al. | 348/521 |
| 2010/0271389 A1 * | 10/2010 | Douglas et al. | 345/619 |

OTHER PUBLICATIONS

The Video Electronics Standards Association (VESA) DisplayPort Standard, Version 1, Revision 1A of Jan. 11, 2008, 238 pages total, © Aug. 2006 VESA.

* cited by examiner

*Primary Examiner* — Zachary K Huson
(74) *Attorney, Agent, or Firm* — Osha Liang LLP (57) ABSTRACT

A video relay circuit is provided including an input channel to receive input video data packets; a first circuit to convert the input video data packets into data for a display device; a second circuit coupled to the first circuit to retime, recondition and re-drive the data channels; an output channel to couple the video data packets into an output stream. Also provided is a video data transmission link including a video relay circuit as above and a daisy chain of video display devices including a video source; a plurality of video display devices wherein a first video display device is coupled to the source of video data, and each further video display device receives the source signal from the previous display and provides the video signal to the next display; wherein at least one of the video display devices comprises a video relay circuit as above.

16 Claims, 6 Drawing Sheets

DIGITAL VIDEO DATA RELAY

BACKGROUND

1. Field of the Invention

The present invention relates to digital video data links and, more specifically, to circuits and methods for linking multiple video display devices.

2. Description of Related Art

Digital display technology for video data streams is being widely adopted within the personal computer (PC) and consumer electronics (CE) industries. The VESA DisplayPort Standard, Version 1, Revision 1a of Jan. 11, 2008 for video data links (hereinafter DisplayPort, or DP), incorporated herein by reference in its entirety, is an example of a standard that may be used for transmission of video data streams. With the advent of digital video signals, the issue of extending the length of transmission links has become more relevant, particularly in applications that make use of multiple video display devices associated with a common video data source.

Current analog video circuits use repeater devices to extend the transmission distance of video data links. However, analog repeaters lack a clock recovery mechanism because of the nature of analog video signals.

Other approaches for extending digital data transmission links include the implementation of optical data transfer in order to extend the transmission distance of the video signal. However, optical data transfer circuits have a high implementation cost, due to the up-front and maintenance cost of components. In addition, opto-electronic conversion devices and protocols are required at both ends of the transmission link, increasing the level of circuit complexity. Furthermore, optical data transfer may not be adapted to digital video protocols commonly used in industry, such as the DP standards above. This imposes the need for extra circuitry and data processing at every node in the optical data transmission link.

Therefore, there is a need for easily adaptable digital video relay circuits that may extend transmission links to multiple display devices.

SUMMARY

A video relay circuit according to some embodiments of the present invention includes an input channel to receive input video data packets from an input video data stream; a first circuit to convert the input video data packets into data for a display device; a second circuit coupled to the first circuit to retime, recondition, and re-drive the data channels; an output channel to receive the video data packets in an output format from the second circuit, and couple the video data packets into an output video data stream.

A video data transmission link according to some embodiments of the present invention includes a video relay circuit further including an input channel to receive input video data packets from an input video data stream; a first circuit to convert the input video data packets into data for a display device; a second circuit coupled to the first circuit to retime, recondition, and re-drive the data channels; an output channel to receive the video data packets in an output format from the second circuit, and couple the video data packets into an output video data stream.

A daisy chain of video display devices according to some embodiments of the present invention includes a source of digital video data; a plurality of video display devices wherein a first video display device is coupled to the source of video data, and each further video display device receives the source video signal from the previous display device and provides the source video signal to the next video display device; further wherein at least one of the video display devices comprises a video relay circuit further including an input channel to receive input video data packets from an input video data stream; a first circuit to convert the input video data packets into data for a display device; a second circuit coupled to the first circuit to retime, recondition, and re-drive the data channels; an output channel to receive the video data packets in an output format from the second transmitter circuit, and couple the video data packets into an output video data stream.

These and other embodiments of the present invention are further described below with reference to the following figures.

BRIEF DESCRIPTION OF THE FIGURES

Wherever possible, the same reference numbers are used throughout the drawings to refer to the same or like elements.

DETAILED DESCRIPTION

Current trends in video signaling are moving from analog data signals to digital data signals. Digital video signals provide greater signal processing capabilities, and enable richer display formats. In many applications, it is desirable to have long transmission links between a source of a video signal and a display device. For example, a computer may be retrieving a video signal via an internet connection and feeding the signal to a flat panel display in a remote location, such as the entertainment center in a home. Other examples may include the retrieval and display of video data from a video camera at a remote location, such as in security or sensing applications.

One problem that arises with long transmission links in digital video data signals is their relatively higher loss rate compared to analog data signals. The higher loss rate is amplified by the large bandwidth used in digital signal transmission. Digital signals are thus highly sensitive to issues such as cable impedance matching. Furthermore, long transmission links may lead to clock and data channel misalignment, with the consequent deterioration of video quality.

Another problem that arises with long transmission links in digital video data signals may be errors induced by interference and external noise. Error-correcting circuits and methods may be used to repair data packets. Furthermore, data skewing and de-skewing strategies may be implemented to provide immunity for the transmission link to external noise.

As the quality of video displays increases, so does the bandwidth used by video circuitry. Thus, the demand increases for a lossless transmission link that can be adapted to longer distances and a multiplicity of devices.

Some embodiments of the present invention may use a video transmission link including a multiplicity of data lanes, or channels. For example, a video transmission link may use four (4) lanes, two (2) lanes, or one (1) lane, to transmit digital video data. Furthermore, some embodiments of the present invention may be coupled to a video transmission link input having a number of lanes, and to a video transmission link output having a different number of lanes. Moreover, some embodiments may include video data arranged according to other specifications and information structures.

Figure 1:
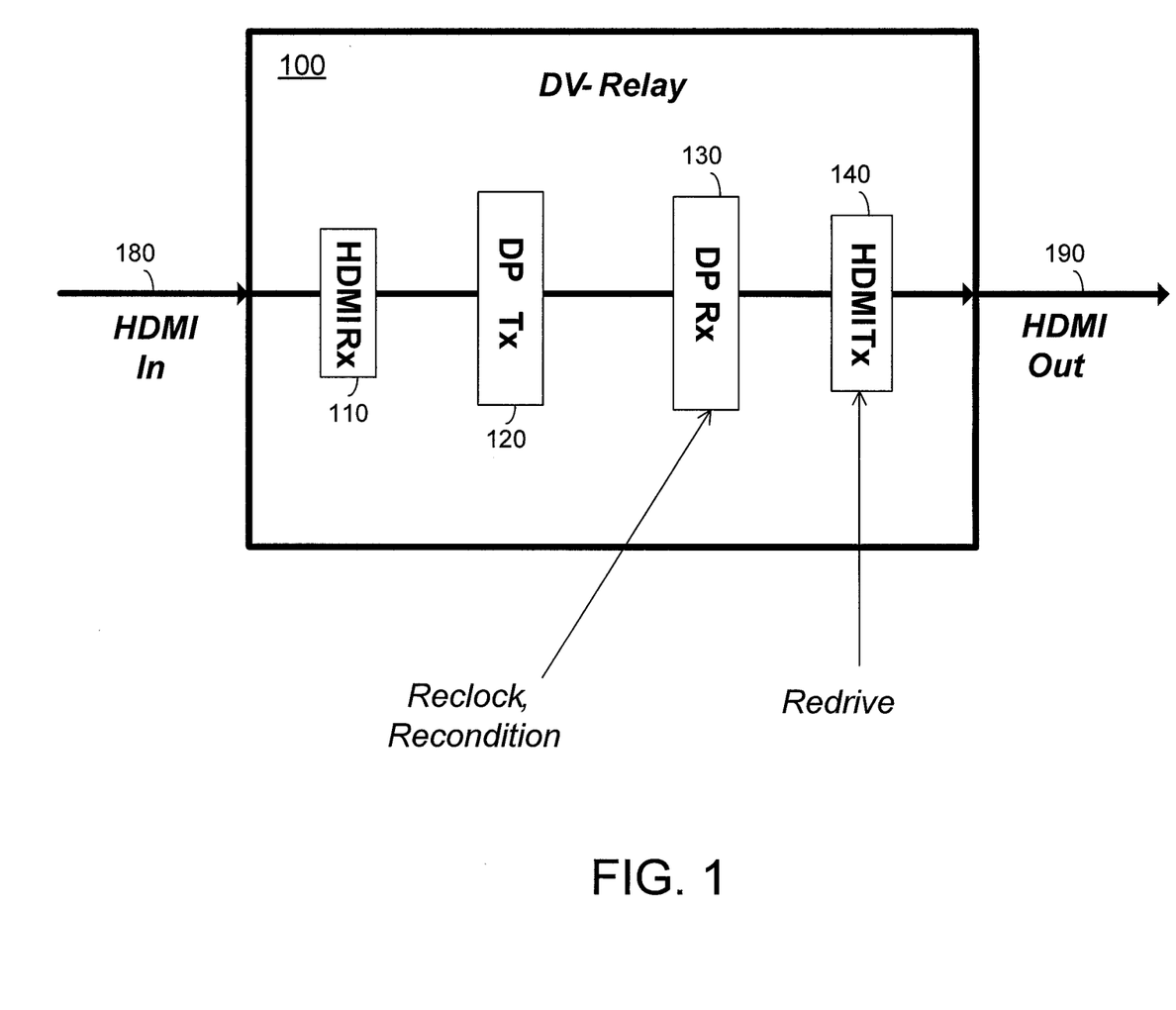
FIG. 1. Shows a digital video relay circuit according to some embodiments of the present invention.

FIG. 1 shows digital video relay circuit 100 according to some embodiments of the present invention. Relay circuit 100 includes input channel 180, and output channel 190. Channels 180 and 190 may be configured to transmit compressed video signals, or uncompressed video signals such as high definition multimedia interface (HDMI), according to some embodiments of the present invention. Some embodiments of the present invention may utilize different information structures for digital data encoding of the video signals.

Some embodiments of the present invention consistent with the DP standard may use channel 180 having a different number of lanes compared to channel 190. For example, channel 180 may use four (4) lanes while channel 190 may use one (1) lane. In some embodiments, channels 180 and 190 may transmit video and audio signals consistent with HDMI standards. Furthermore, some embodiments may transmit signals consistent with different standards and specifications.

According to the embodiment depicted in FIG. 1, relay circuit 100 first inputs the digital video data to receiver circuit 110. Receiver 110 may be an HDMI receiver circuit, for example when the digital signal is encoded in HDMI format. Relay 100 converts data packets received from circuit 110 into data packets that may be transmitted to and used by a video display device in circuit 120. In some embodiments of the present invention, the video display device may be a DisplayPort ("DP") unit, being configured according to DP specifications, thus circuit 120 may be a DisplayPort transmission circuit. In some embodiments data packets from transmission circuit 120 may be sent to a video display device. From transmission circuit 120, the data packets are received by receiver circuit 130. In some embodiments of relay 100, a video display device may not be linked to transmission circuit 120, in which case data packets are directly sent to receiver circuit 130.

Receiver circuit 130 performs a clock recovery operation and reconditions the data packet according to the video display configuration. Some embodiments of the present invention may use a DP protocol to configure the data packets received by circuit 130. For example, some embodiments of the present invention may use the embedded clocking features of the DP protocol (cf. the DP specification) to perform the clock recovery of the digital signal, and recondition the clock channel and the data channels. According to some embodiments of the present invention, the reconditioning of the signal may include the time re-alignment of the clock channel and the different data channels into the data packets according to the DP specification. The re-alignment of the clock channel and the different data channels may also be referred to as 'retiming' of the data channels. Further, the data reconditioning and the clock recovery may be performed in circuit 130 by using information contained in the video data stream provided by circuit 120.

According to some embodiments of the present invention, relay circuit 100 may provide isochronous transport services to the transmission link in receiving circuit 130. Isochronous transport services are described in detail in the DP specification and may include: 'packing' and 'unpacking' of the data stream; 'stuffing' and 'unstuffing'; 'framing' and 'unframing'; inter-lane 'skewing' and 'deskewing'. In some embodiments of the present invention, 'stuffing' the data stream includes placing dummy characters in unused time slots. Further, according to some embodiments inter-lane 'skewing' of the data stream may include placing a preselected time delay between different lanes in the data stream. This 'skewing' of the data stream may reduce the adverse effect of noise interference in the signal by exposing only a portion of the data stream to the noise event at any given time.

Video relay circuit 100, according to some embodiments of the present invention, may provide a stream clock recovery and insertion of main stream attributes data. Optionally, secondary data packets may be inserted into the data stream in circuit 130. In some embodiments of the present invention, such secondary data packets may include error correction codes (ECC), or an audio stream packet.

Data reconditioning may be necessary in some embodiments due to different impedance conditions between different data channels and the clock channel along a transmission link. The data packets thus reconditioned are sent from receiver unit 130 to transmitter 140.

Transmitter 140 re-drives the video data packets into an output format and puts them on output data channel 190. In some embodiments of the present invention, transmitter 140 converts the data packets into an HDMI configuration, as shown in FIG. 1, although other configurations may be used.

Figure 2:
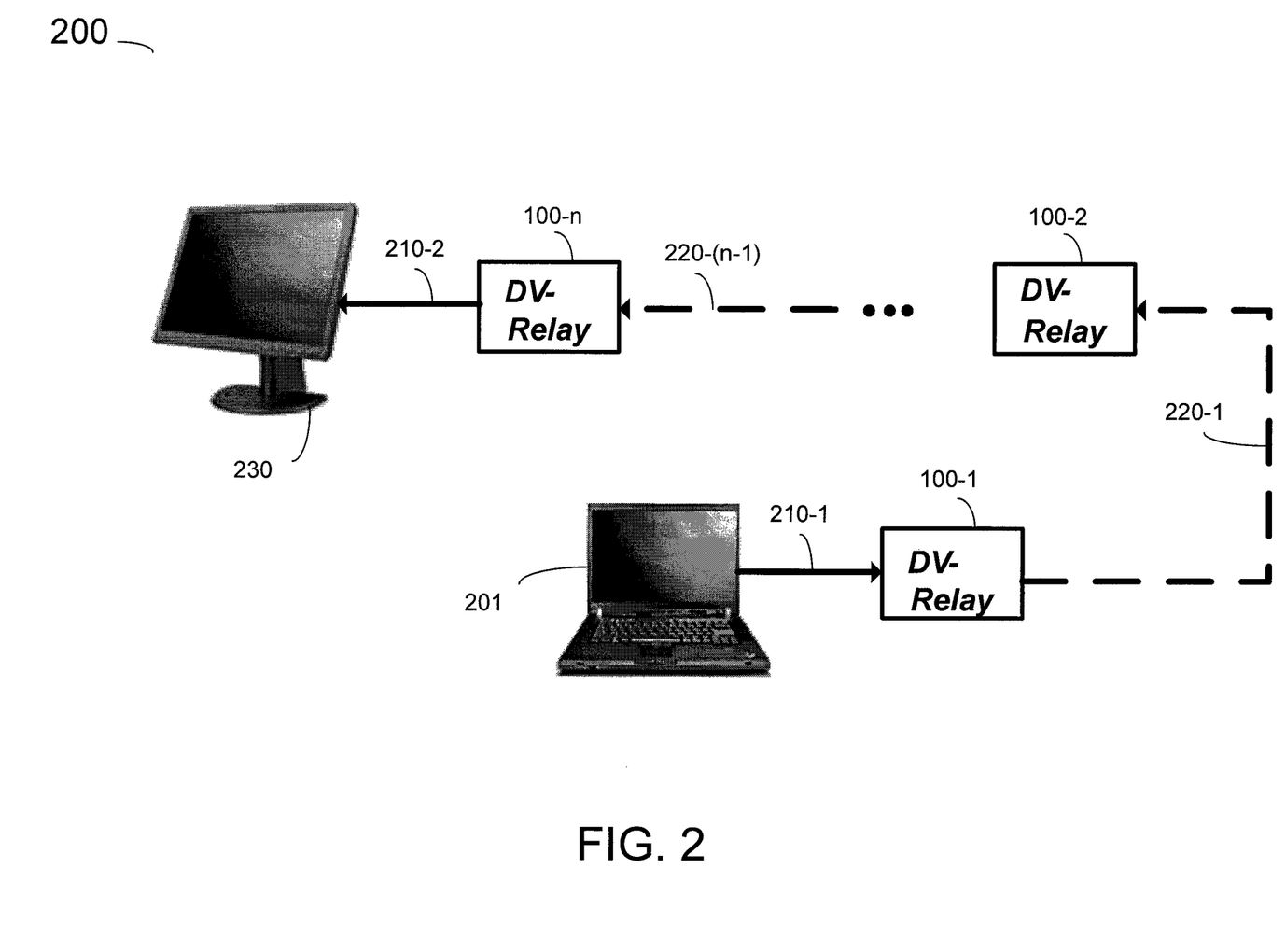
FIG. 2. Shows a video transmission link including a video data source, a plurality of video relay circuits, and a video display device according to some embodiments of the present invention.

FIG. 2 shows a video transmission link 200 including video data source 201, a plurality of 'n' video relay circuits 100-1, 100-2, to 100-n, and video display device 220, according to some embodiments of the present invention. Some embodiments of the present invention may include a PC or a laptop computer as video data source 201. In general, source 201 can be any video source. For example, source 201 may be a computer downloading video data from a live stream in a data network, via a cable or a wireless connection. Source 201 may provide digital video data from memory, via a storage location in the hard drive or from a memory buffer associated with a processor that generates a video data stream. Some embodiments of the present invention may include a video camera capturing a live scene as data source 201. Furthermore, in some embodiments video data source 201 may include a video camera capturing a live scene feeding the data stream to a computer, which performs editing of the video data before providing the data stream to a video relay 100-1 through transmission link 210-1.

Digital relay 100-1 depicted in FIG. 2 can be as described in detail with relation to FIG. 1 above. Relay 100-1 reconditions the digital video data stream provided by source 201 after the data stream has traveled through link 210-1. Relay 100-1 outputs the video data stream to a second relay 100-2, through data link 220-1. From relay 100-2 the video data stream is input to a number 'n' of relay circuits through a number 'n−1' of data links. From relay 100-n, the reconditioned video data stream is input to display device 230 through link 210-2. Thus, some embodiments of the present invention as depicted in FIG. 2 may extend the length of the transmission link between data source 200-1 and display device 230, to any desired length. Some embodiments of the present invention may use more than one relay circuit, or only one, depending on the desired length of the transmission link.

Further, some embodiments of the present invention may include a video display device coupled to any one of the relay circuits 100-1 to 100-*n*.

Figure 3:
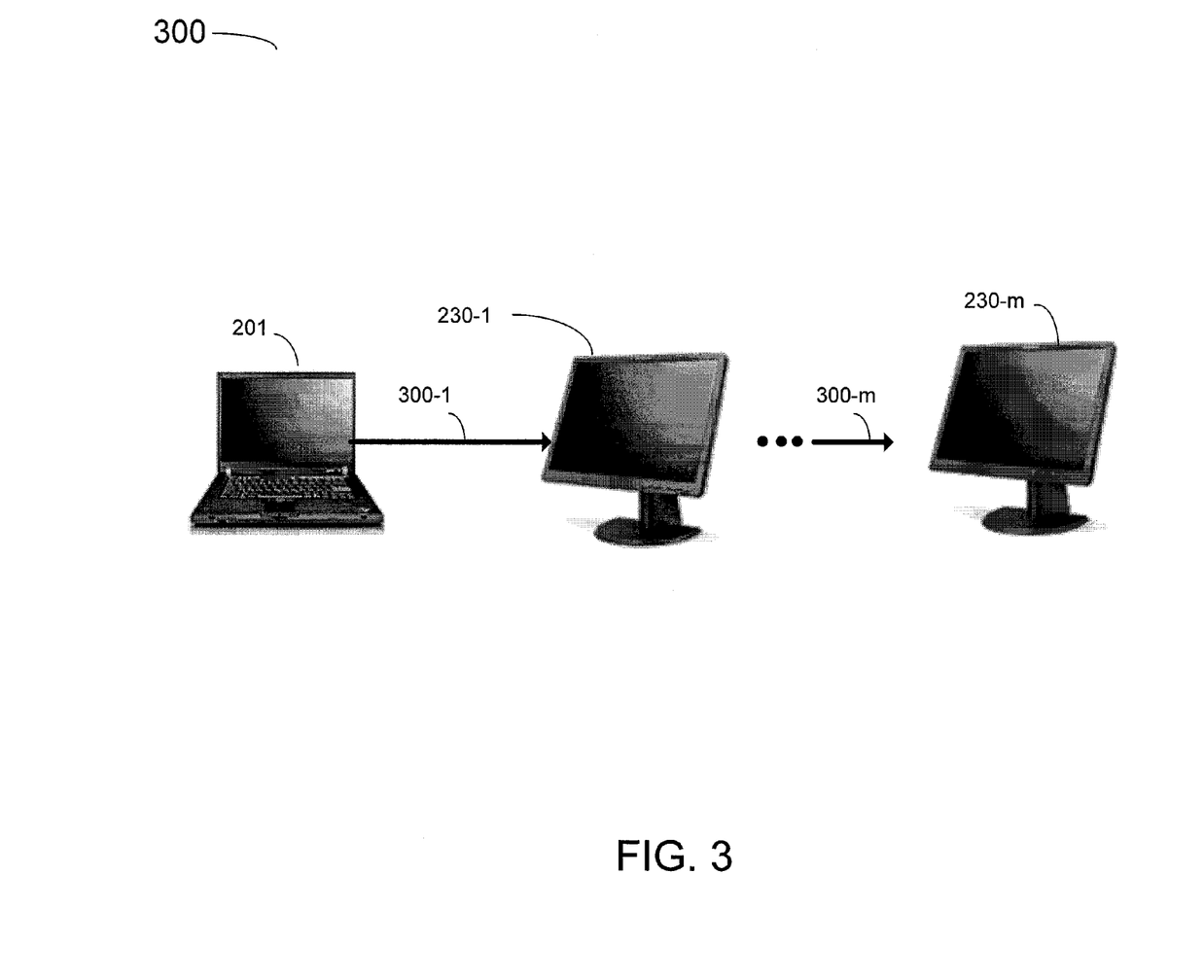
FIG. 3. Shows a video transmission link including a video data source and a daisy chain of video display devices according to some embodiments of the present invention.

FIG. 3 shows a video transmission link 300 including video data source 201 and a daisy chain of 'm' video display devices 230-1 to 230-*m*, according to some embodiments of the present invention. The number 'm' may be any arbitrary integer number. Video data source 201 in the embodiment depicted in FIG. 3 may be as described in detail in relation to FIG. 2 above. Source 201 inputs the digital video stream to display device 230-1 through transmission link 300-1. Display device 230-1 may include a relay circuit 100 as depicted in FIG. 1 above (cf. FIG. 4). Thus, some embodiments of daisy chain 300 may include display devices 230-1 to 230-*m* such that each display device may be associated with a relay circuit 100. More particularly, each display device 230-1 to 230-*m* may receive video data packets from transmission circuit 120 in a relay circuit 100 and transmit video data packets to receiver circuit 130 in relay circuit 100 (cf. FIG. 1). Once the video data stream has passed through display device 230-1, it is transmitted to display device 230-2 through transmission link 300-2. The process is repeated through display device 230-3 and transmission links 300-3 and 300-4 until the end of the daisy chain is reached in display device 230-*m*. Some embodiments of the present invention may include a large number of display devices. As explained above, the data reconditioning performed by relay circuit 100 in every display device 230-1 to 230-*m* along daisy chain 300 enables a chain 300 of any desired length to be implemented.

Furthermore, some embodiments of the present invention as depicted in FIG. 3 may be such that some of the display devices from 230-1 to 230-*m* may include a relay circuit 100 as in FIG. 1 above, and some others may not include a relay circuit 100. For example, some embodiments of daisy chain 300 may be such that only a selected number of display devices from 230-1 to 230-*m*, but not all of them, may include a video relay circuit 100 as in FIG. 1.

Figure 4:
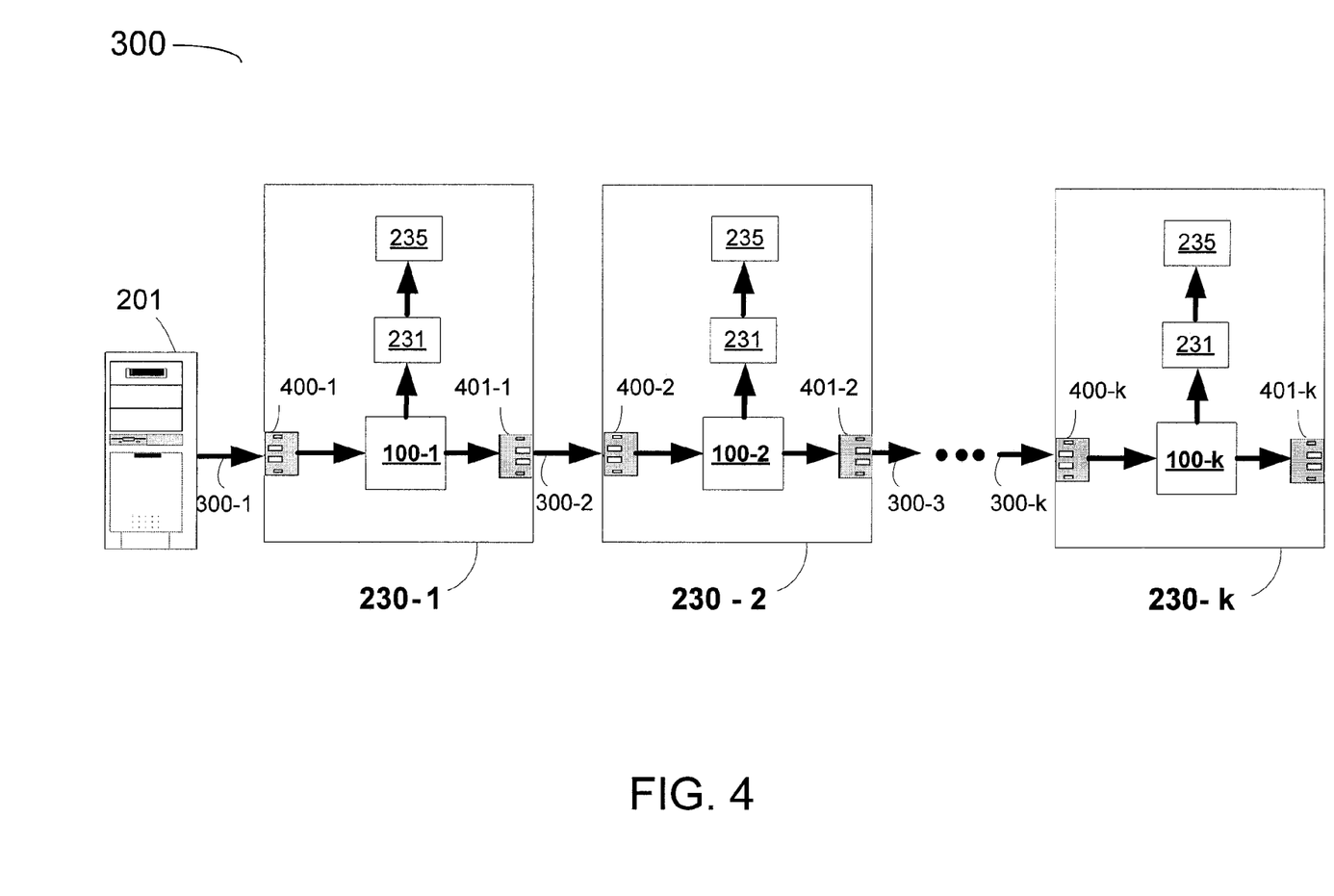
FIG. 4. Shows in detail a video transmission link as in FIG. 3 above, according to some embodiments of the present invention.

FIG. 4 shows in detail video transmission link 300 as in FIG. 3 above, according to some embodiments of the present invention. Video source 201 has been described in detail with relation to FIGS. 2 and 3. In FIG. 4, a number 'k' of display devices 230-1, 230-2 to 230-*k* are linked together in daisy chain 300. The number 'k' in FIG. 4 may be any integer number. Each display device 230-*i* in daisy chain 300 may include a relay circuit 100-*i* as described in detail in FIG. 1, where T is any integer between 1 and 'k.' Relay 100-*i* in display device 230-*i* provides video data packets to receiver circuit 231. In some embodiments, the video data packets provided by relay 100-*i* are configured, for example, according to DP specifications. Video data packets from receiver circuit 231 are then transferred to display controller 235, which ultimately provides a video image out of display device 230-*i*.

Also shown in FIG. 4 are adaptors 400-1, to 400-*k*, and 401-1 to 401-*k* that couple transmission links 300-1 to 300-*k* 'in' to (400-1 to 400-*k*) and 'out' of (401-1 to 401-*k*) display devices 230-1 to 230-*k*, according to some embodiments of the present invention. Thus, adapter 400-1 may couple transmission link 300-1 into display device 230-1. And adapter 401-1 may couple display device 230-1 out to transmission link 300-2. Likewise, adapter 400-*k* may couple transmission link 300-*k* into display device 230-*k*, and adapter 401-*k* may couple display device 230-*k* to an output transmission link (not shown in FIG. 4). In some embodiments of the present invention, adapters 400-*i* may be universal serial bus (USB) adapters.

Figure 5:
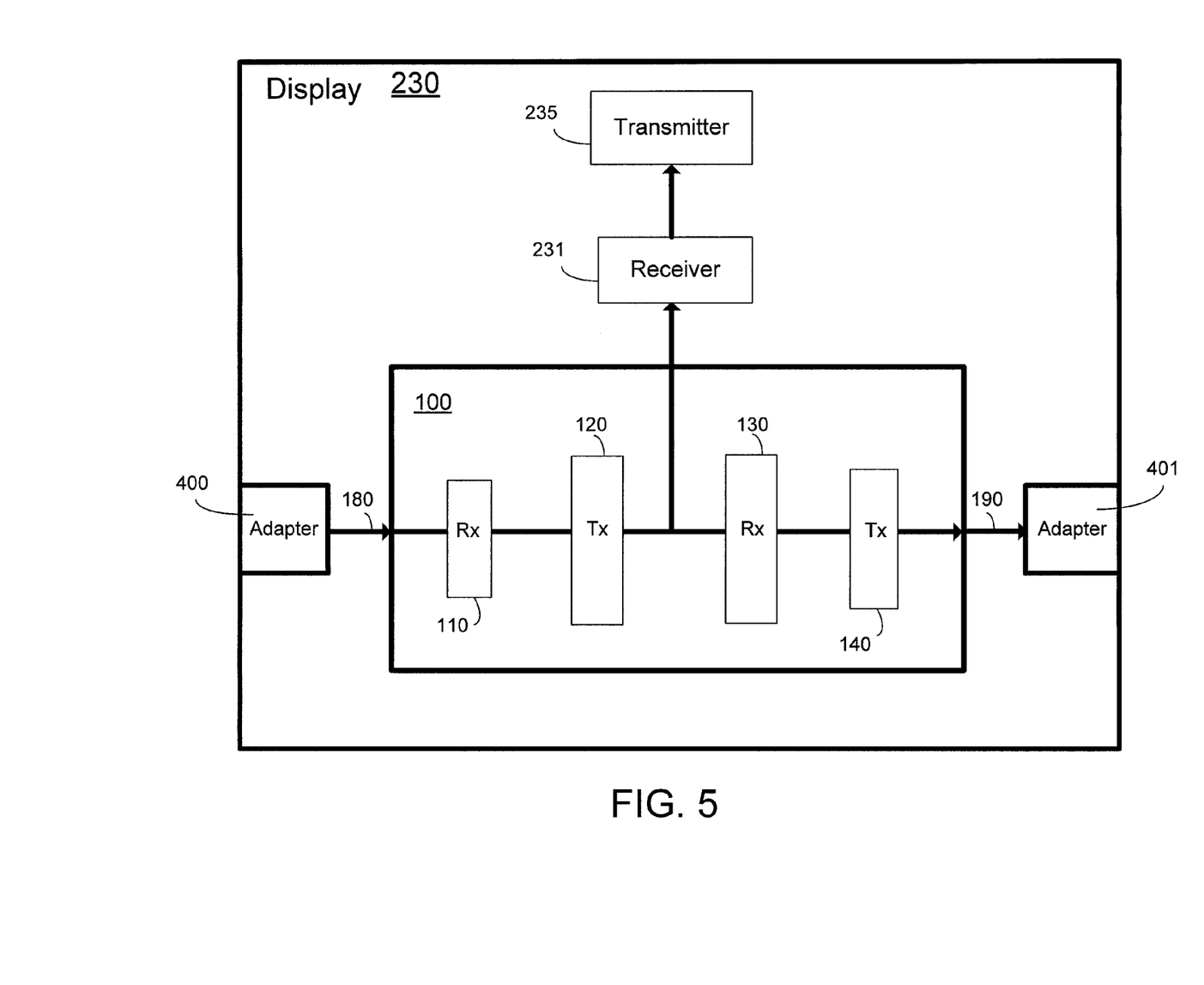
FIG. 5. Shows a video relay circuit used in a video transmission link as in FIGS. 3 and 4 above, according to some embodiments of the present invention.

FIG. 5 shows video relay circuit 100 used in a video transmission link 300 as in FIGS. 3 and 4 above, according to some embodiments of the present invention. Video data stream is transferred into relay circuit 100 through adapter 400 and input channel 180 (cf. FIG. 1). The video data packets provided by relay circuit 100 to display device 230 are coupled into receiver 231 from transmission unit 120 (cf. FIG. 1 above). Receiver 231 provides the video data to transmitter 235 to adapt the video data stream to display device 230. The video data stream is then reconditioned in circuit 100 and the clock recovered from transmitter 120 to receiver 130 (cf. FIG. 6, below). Further, the video data stream is re-driven into the transmission link in unit 140 through output channel 190 and adapter 401.

Figure 6:
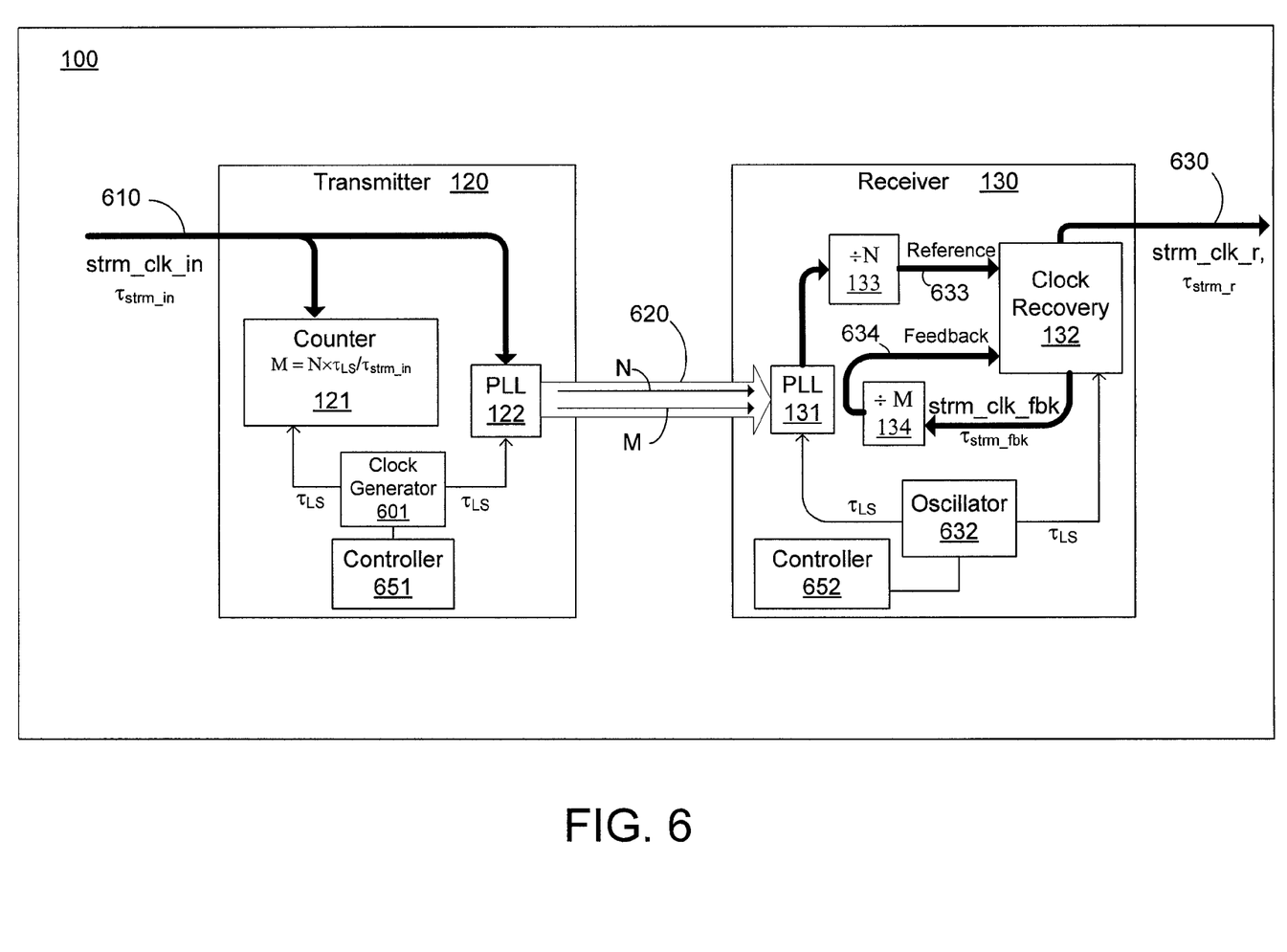
FIG. 6 Shows a video relay circuit configured to perform retime, recondition, and re-driving of data channels in a video transmission link according to some embodiments of the present invention.

FIG. 6 shows video relay circuit 100 configured to perform retime, recondition, and re-driving of data channels in a video transmission link according to some embodiments of the present invention. Relay circuit 100 may include transmitter 120 and receiver 130, as described in detail above in relation to FIG. 1. In the embodiments such as depicted in FIG. 6, transmitter 120 may receive streaming data 610 from a display device, having a clock signal 'strm_clk_in.' Clock signal 'strm_clk_in' corresponds to a time period 'τhd strm$_{in}$' which may be similar or equal to a streaming time period $\tau_{strm}$; given by the specification of the video display device. Transmitter 120 then provides the video data to receiver 130 through link signal 620. Data in link signal 620 may be transmitted at a rate corresponding to a time period '$\tau_{LS\_clk}$.' Receiver 130 converts link signal 620 into video data stream 630 at a recovered streaming rate '$\tau_{strm\_r}$.' Streaming video time period '$\tau_{strm}$' and link signal time period '$\tau_{LS}$' may be related by numbers 'M' and 'N' as follows:

$$\frac{1}{\tau_{strm}} = \frac{M}{N} \times \frac{1}{\tau_{LS}}. \tag{1}$$

In some embodiments of the present invention the values of 'M' and 'N' may be integers associated with time stamps embedded in data streams 610, 620, and 630. Thus, embodiments of transmitter 120 and receiver 130 as depicted in FIG. 6 may provide a mapping between stream data, at a rate '$\tau_{strm}$,' and link signal, at a rate '$\tau_{LS}$,' given by Eq. (1) above.

Transmitter 120 may include clock generator 601, and controller 651. Receiver 130 may include crystal oscillator 632, and controller 652, according to some embodiments of the present invention. Generator 601 creates a clock signal having a period '$\tau_{LS}$' that may be provided to counter 121 and phase locked loop (PLL) 122. In some embodiments, circuit 601 may be controlled by controller 651. Likewise, oscillator 632 may provide a clock signal having a period '$\tau_{LS}$' to PLL circuit 131 and clock recovery circuit 132, in receiver 130. In some embodiments, circuit 632 may be a voltage controlled oscillator controlled by circuit 652.

Transmitter 120 may receive the digital video data stream 610 from circuit 110 (not shown in FIG. 6, cf. FIG. 1). Using clock signal '$\tau_{LS}$' from clock 601 and data stream 610, counter 121 may provide a value 'M' by counting the data symbols contained in a portion of data stream of time length equal to N×$\tau_{LS}$.

Some embodiments of the present invention, such as depicted in FIG. 6, may include PLL circuit 122 to provide link signal 620 to receiver 130. The data stream in video link signal 620 may have a time period '$\tau_{LS}$' as provided to PLL 122 by clock 601. In some embodiments, time period '$\tau_{LS}$' may be determined by the DP standard. Furthermore, according to some embodiments, link signal 620 may include the values of time stamps 'M' and 'N.' Integer value 'M' may be provided by counter 121 as described above.

Some embodiments of receiver circuit 130 may include PLL 131 to synchronize data stream 620 to the signal provided by oscillator 632 having time period '$\tau_{LS}$.' Synchronization by PLL 131 may correct possible time shifting and jitter of data stream 620 between transmitter 120 and receiver 130.

Circuit 133 provides reference pulse 633 to recovery circuit 132, using the signal provided by PLL 131 and the integer 'N' embedded in link signal 620. In some embodiments of the present invention, circuit 133 may be a frequency divider to divide the frequency of the signal provided by PLL 131 by an integer factor 'N.' Feedback signal 634 is generated in divider circuit 134. Divider circuit 134 receives signal 'strm_clk_fbk' from recovery circuit 132, and divides the frequency of this signal by the factor 'M' embedded in link signal 620. Signal 'strm_clk_fbk' has a time period '$\tau_{strm\_fbk}$,' that may be similar to a recovery time period '$\tau_{strm\_r}$.' Divider 134 then provides feedback 634 to clock recovery circuit 132 in receiver 130. Reference pulse 633 and feedback pulse 634 are provided to clock recovery circuit 132, which synchronizes the two pulses using a feedback mechanism. Thus, receiver 130 in the embodiments depicted in FIG. 6 may provide a retiming for video stream 610 to produce video stream 630 satisfying Eq. (1). For example, the value of '$\tau_{strm}$' in Eq. (1) may be a recovered stream period, determined by the specification of a video display device to be used in conjunction with relay circuit 100. The value of 'N' may be retrieved from link signal 620, and the value of 'M' may be as obtained from counter 121 in the embodiments depicted in FIG. 6.

According to some embodiments of the present invention as described above, signal 633 has a frequency $f_{Ref}$, and signal 634 has a frequency $f_{Fbk}$, given as $$f_{Ref} = \frac{f_{LS}}{N}, \text{ and} \quad (2)$$

$$f_{Fbk} = \frac{f_{strm\_fbk}}{M}. \quad (3)$$

Where $f_{strm\_fbk}=1/\text{'}\tau_{strm\_fbk}\text{'}$ and $f_{LS}=1/\text{'}\tau_{LS}\text{.'}$ The values of $f_{Ref}$ and $f_{Fbk}$ may be different due to unexpected events in video link signal 620, or signal distortion in video data stream 610. For example, signal distortion may occur in stream 610 due to the high bandwidth of the signal combined with a long transmission link. In some embodiments of the present invention, the reference pulse frequency and the feedback pulse frequency may be synchronized by recovery circuit 132. In some embodiments of the present invention, recovery circuit 132 may include a PLL circuit, with a voltage controlled oscillator, which may be controlled by circuit 652.

Clock recovery circuit 132 performs the synchronization of reference 633 and feedback 634, and may use a synchronization factor thus obtained to further retime video data stream 620 provided by PLL 131 and provide data stream 630. Note that while the synchronization factor may be obtained by comparing reference signal 633 to feedback signal 634, data stream 630 may have a 'recovered' clock and timing configuration according to output video stream 'strm_clk_r' having a clock timing period '$\tau_{strm\_r}$.' While '$\tau_{strm\_in}$' may be different from '$\tau_{strm\_r}$' the latter may be adjusted according to the proper configuration of the display device. Thus, some embodiments of the present invention may recondition the stream clock signal in a video data transmission link. Data stream 630 may be 're-driven' and distributed further down the transmission link by transmitter 140 (cf. FIG. 1) at a link symbol clock period, '$\tau_{LS}$.' In some embodiments of the present invention the specified values for the '$\tau_{LS}$' signal may be as described in detail according to the DP specification.

Embodiments of the invention described above are exemplary only. One skilled in the art may recognize various alternative embodiments from those specifically disclosed. Those alternative embodiments are also intended to be within the scope of this disclosure. As such, the invention is limited only by the following claims.

The invention claimed is:

1. A video relay circuit, comprising:
   an input channel adapted to receive input video data packets from an input video data stream, wherein the input video data stream is in High Definition Multimedia Interface (HDMI) format and is associated with a stream clock signal having a first period;
   a first circuit configured to:
      generate a local clock signal having a second period;
      convert the input video data packets into DisplayPort (DP) video data packets for a display device; and
      transmit, in a link signal, the DP video data packets and a factor relating the first period to the second period;
   a second circuit coupled to the first circuit and configured to:
      receive the link signal from the first circuit;
      obtain the factor from the link signal;
      recover, based on the factor and the second period, the stream clock signal; and
      retime and recondition the DP video data packets using the stream clock signal; and
   an output channel adapted to receive the DP video data packets from the second circuit, and to provide the DP video data packets into an output video data stream associated with the stream clock signal, wherein the output video data stream is in HDMI format.

2. The video relay circuit of claim 1, wherein the input channel is coupled to a video data transmission link having digital data channels and the stream clock signal.

3. The video relay circuit of claim 1, further comprising:
   a receiver circuit coupled to the input channel and adapted to receive the input video data packets; and
   a transmitter circuit coupled to the second circuit and adapted to re-drive the video data packets into an output format.

4. The video relay circuit of claim 1, wherein recondition of the data channels by the second circuit comprises providing isochronous transport services to a transmission link.

5. The video relay circuit of claim 4, wherein the isochronous transport services are selected from the group consisting of: packing/unpacking, stuffing/unstuffing, framing/unframing, and inter-lane skewing/deskewing.

6. The video relay circuit of claim 1, wherein the data for a display device provided by the first circuit further comprises:
   dummy characters replacing unused time slots; and
   frames having inter-lane data skewed in time.

7. The video relay circuit of claim 6, wherein the data for a display device provided by the first circuit further comprises:
   removing the dummy characters replacing unused time slots;
   disassembling the frames; and
   re-aligning the inter-lane data in time.

8. The video relay circuit of claim 1, wherein the first circuit is a transmitter comprising a first phase-locked loop (PLL) circuit and further including a local clock providing the local clock signal to the first PLL circuit.

9. The video relay circuit of claim 8, wherein the second circuit is a receiver circuit having:
    a second PLL circuit including a local oscillator providing a signal to the second PLL circuit, and
    a clock recovery circuit using a reference pulse and a feedback pulse to retime, recondition, and re-drive the data channels.

10. The video relay circuit of claim 9, wherein the second circuit further includes:
    a first frequency divider circuit to provide the reference pulse, and
    a second frequency divider circuit to provide the feedback pulse.

11. A video data transmission link, comprising:
    an input channel adapted to receive input video data packets from a single input video data stream having one or more input lanes and associated with a stream clock signal having a first period;
    a first circuit configured to:
        generate a local clock signal having a second time period;
        convert the input video data packets into data for a display device; and
        transmit, in a link signal, the data for the display device and a factor relating the first period to the second period;
    a second circuit coupled to the first circuit and configured to:
        receive the link signal from the first circuit;
        obtain the factor from the link signal;
        recover, based on the factor and the second period, the stream clock signal;
        retime and recondition the converted data using the stream clock signal; and
    an output channel configured to:
        receive the video data packets in an output format from the second circuit; and
        provide the video data packets into a single output video data stream having one or more output lanes, wherein the number of output lanes is different than the number of input lanes.

12. The video data transmission link of claim 11, further including:
    a receiver circuit couple to the input channel and adapted to receive the input video data packets; and
    a transmitter circuit couple to the second circuit and adapted to re-drive the video data packets reconditioned in the second circuit into an output format.

13. A daisy chain of video display devices, comprising:
    a source of digital video data;
    a plurality of video display devices wherein a first video display device is coupled to the source of the video data, and each further video display device receives the sources video signal from the previous display device and provides the source video signal to the next video display device;
    further wherein at least one of the video display devices comprises a video relay circuit further comprising:
        an input channel adapted to receive input video data packets from an input video data stream, wherein the input video data stream is in High Definition Multimedia Interface (HDMI) format associated with a stream clock signal having a first period;
        a first circuit configured to:
            generate a local clock signal having a second period;
            convert the input video data packets into DisplayPort (DP) video data packets for a display device; and
            transmit, in a link signal, the DP video data packets and a factor relating the first period to the second period;
        a second circuit coupled to the first circuit and configured to:
            receive the link signal from the first circuit;
            obtain the factor from the link signal;
            recover, based on the factor and the second period, the stream clock signal; and
            retime and recondition the DP video data packets using the stream clock signal; and
        an output channel adapted to receive the DP video data packets from the second circuit, and to provide the DP video data packets into an output video data stream, wherein the output video data stream is in HDMI format.

14. The video relay circuit of claim 1, wherein the input video data stream has one or more input lanes, the output video data stream has one or more output lanes, and the number of output lanes is different than the number of input lanes.

15. The video data transmission link of claim 11, wherein the single input video data stream is in HDMI format, the first circuit converts the input video data packets into DisplayPort (DP) video data packets, and the single output video data stream is in HDMI format.

16. The daisy chain of video display devices of claim 13, wherein the input video data stream has one or more input lanes, the output video data stream has one or more output lanes, and the number of output lanes is different than the number of input lanes.

* * * * *